United States Patent [19]
Draxelmayr

[11] Patent Number: 5,982,216
[45] Date of Patent: *Nov. 9, 1999

[54] CIRCUIT CONFIGURATION FOR REDUCING INJECTION OF MINORITY CARRIERS INTO A SUBSTRATE

[75] Inventor: Dieter Draxelmayr, Villach, Austria

[73] Assignee: Siemens Aktiegesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/974,257

[22] Filed: Nov. 19, 1997

Related U.S. Application Data

[63] Continuation of application No. PCT/DE96/00859, May 15, 1996.

[51] Int. Cl.⁶ .................................................. H01L 29/00
[52] U.S. Cl. ......................... 327/309; 327/384; 257/556; 257/373
[58] Field of Search ..................................... 327/309, 384, 327/534, 536, 546, 566, 564, 427, 306; 257/372, 556, 373

[56] References Cited

U.S. PATENT DOCUMENTS

| | | | |
|---|---|---|---|
| 4,763,021 | 8/1988 | Stickel | 327/541 |
| 5,168,176 | 12/1992 | Wanlass | 326/87 |

FOREIGN PATENT DOCUMENTS

| | | |
|---|---|---|
| 0284979A1 | 10/1988 | European Pat. Off. . |
| 0409158A1 | 1/1991 | European Pat. Off. . |

*Primary Examiner*—Dinh T. Le
*Attorney, Agent, or Firm*—Herbert L. Lerner; Laurence A. Greenberg

[57] ABSTRACT

A circuit configuration for reducing an injection of minority carriers into a substrate protects against malfunction due to injected minority carriers by providing a series circuit connected to an external terminal. The series circuit has a transistor and a diode disposed between a supply potential and the external terminal and fed back through a control loop from the external terminal to a control terminal of the transistor.

6 Claims, 1 Drawing Sheet

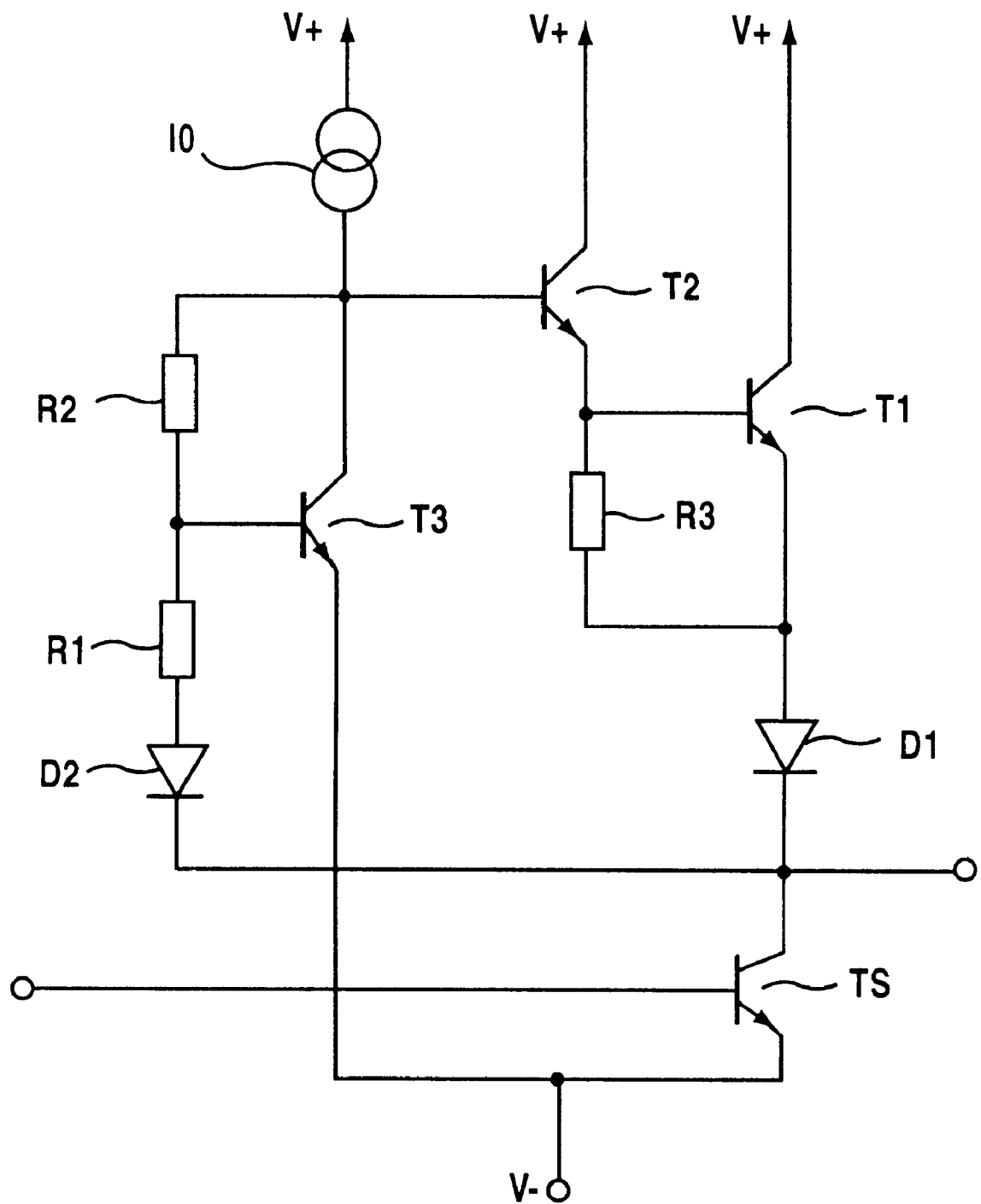

ns: 5,982,216

CIRCUIT CONFIGURATION FOR REDUCING INJECTION OF MINORITY CARRIERS INTO A SUBSTRATE

CROSS-REFERENCE TO RELATED APPLICATION

This application is a continuation of International Application Ser. No. PCT/DE96/00859, filed May 15, 1996.

BACKGROUND OF THE INVENTION

FIELD OF THE INVENTION

The invention relates to a circuit configuration for reducing injection of minority carriers into a substrate containing regions forming a pn junction, including a transistor connected to an external terminal of the circuit configuration.

Integrated semiconductor circuits contain a substrate, in which respective p-doped and n-doped regions are embedded with a predetermined structure. For example, n-doped wells which receive electrical components may be disposed on a p-type substrate. The pn junction with the substrate must always be reverse-biased so that no minority carriers are injected into the substrate. Such minority carriers spread by diffusion and, if they reach other circuit elements, cause malfunctions because of their parasitic properties. For that reason, on one hand the substrate is typically connected to the lowest potential of the circuit. On the other hand it is known that external connections to the integrated circuit entail problems with the circuit. The external terminals of the circuit, in particular the inputs and outputs of the circuit, therefore constitute particularly critical points.

If the current flowing through them is interrupted suddenly, loads which have an inductive component can produce a back-emf. Other problems are also possible, for example resulting from changes in the supply voltage. The effects result in a minority carrier current being injected into the substrate and being on the order of magnitude of the working current through a transistor. The back of the chip and the wells over the substrate act as sinks for the charge carriers. The motion of the minority carriers due to the concentration gradient causes so-called transverse currents. Only a fraction of the minority carriers combines in the substrate, since the crystalline quality of the substrate is generally so good that only low recombination rates, that is to say long carrier lifetimes, occur. The component wells of the circuit must therefore take up large transverse currents, which leads to undesired activation of parasitic bipolar transistors and therefore to malfunctions.

Published European Patent Application 0 284 979 A1 discloses a substrate which in each case is connected through a diode to the external terminal, or to a reference terminal for connection to a reference potential. In addition, German Published, Non-prosecuted Patent Application DE 44 11 869 A1, corresponding to allowed U.S. application Ser. No. 08/417,825, filed Apr. 6, 1995, discloses that a heavily doped substrate having an overlying weakly doped layer of the same conductivity is used, and that the wells are surrounded by a protective ring. Although that measure does not actually impede the injection of minority carriers, it greatly restricts the spreading of the charge carriers. Furthermore, a measure of that type is only of very limited effect in typical bipolar technologies, since substrates having epitaxial layers as in MOS technologies are not used.

Published European Patent Application 0 409 158 A1, corresponding to U.S. Pat. No. 3,058,428, discloses a circuit configuration for reducing injection of minority carriers into a substrate, in which a control loop, including a comparator and a transistor, is formed in conjunction with a working circuit.

SUMMARY OF THE INVENTION

It is accordingly an object of the invention to provide a circuit configuration for avoiding or at least reducing injection of minority carriers into a substrate, which overcomes the hereinafore-mentioned disadvantages of the heretofore-known devices of this general type.

With the foregoing and other objects in view there is provided, in accordance with the invention, a circuit configuration for reducing injection of minority carriers into a substrate containing regions forming a pn junction, the circuit configuration comprising an external terminal; a transistor connected to the external terminal; a series circuit disposed between a supply potential and the external terminal, the series circuit having a first diode and a first transistor with a control terminal; and a control loop connected to the external terminal and to the control terminal of the first transistor.

In accordance with another feature of the invention, the control loop includes a control transistor having an output side and a control terminal, the output side of the control transistor is connected to a reference potential and to the control terminal of the first transistor, and a resistor and a second diode are connected between the control terminal of the control transistor and the external terminal.

In accordance with a further feature of the invention, the control transistor has an output terminal, and another resistor is connected between the output terminal of the control transistor and the control terminal of the control transistor.

In accordance with an added feature of the invention, a second transistor is connected upstream of the first transistor, the second transistor has a control input connected to the output terminal of the control transistor, and the second transistor has an output terminal connected to the supply potential and an output terminal connected to the control terminal of the first transistor.

In accordance with an additional feature of the invention, the first transistor has an output, one of the output terminals of the second transistor and the control terminal of the first transistor define a point of connection, and a further resistor is connected between the point of connection and the output of the first transistor.

In accordance with a concomitant feature of the invention, the diodes have cathodes connected to the external terminal.

Other features which are considered as characteristic for the invention are set forth in the appended claims.

Although the invention is illustrated and described herein as embodied in a circuit configuration for reducing an injection of minority carriers into a substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a schematic diagram of a circuit configuration according to the invention.

DESCRIPTION OF THE PREFERRED EMBODIMENTS

Referring now in detail to the single FIGURE of the drawing, there is seen an example of a working circuit produced on or in a substrate, which is a switching transistor TS having a base connected to an input terminal I and a collector connected to an output terminal O. The transistor TS has an emitter at a reference potential V−. The switching transistor TS may, for example, be produced as an npn transistor in usual bipolar technology, in or on a substrate. The working circuit may also be a more intricate and elaborate circuit, and the transistor TS thus represents merely the simplest example.

The injection of minority carriers into the substrate is, in particular, prevented by a series circuit including a first transistor T1, a second transistor T2 and a first diode D1, which is disposed between a supply potential V+ and the output terminal or external terminal O of the circuit. In this case, the transistor T2 has an emitter connected to the base of the transistor T1, and the transistor T1 has an emitter connected through the diode D1 to the external terminal O. The diode D1 has a cathode side connected to the external terminal O. The emitter of the transistor T2 is additionally connected through a resistor R3 to the emitter of the transistor T1. The transistors T1 and T2 have collectors at the positive supply potential V+. In the case of a circuit of this type, protection against minority carriers is provided if just the base of the transistors T1 or T2 is connected to a reference potential. This embodiment is not expressly represented in the FIGURE.

The elements T1 and D1 are necessary for the minority carrier suppression function. If a problem of this type is, for example, brought upon the circuit through the external terminal O, the diode D1 protects the emitter of the transistor T1 from breakdown. The transistor T1 is needed as a power transistor in order to make it possible to take up energetic pulses at the terminal O. The transistor T2 is a Darlington transistor, so that a collector of a transistor T3 is not excessively loaded in the event of a large current. In the case of smaller currents, the transistor T2 and the resistor R3 may be omitted, and the base of the transistor T1 may be connected directly to the collector of the transistor T3. According to the FIGURE, the transistor T2 supplies the base of the transistor T1 with the requisite current when the protective circuit is activated.

It is possible for the effectiveness of the above-described circuit configuration acting against the injection of minority carriers to be limited, since the voltage of the series circuit including the two transistors T1 and T2 and the first diode D1 is not constant enough. For this reason, the invention proposes a further illustrative embodiment, in which a control loop is provided from the external terminal O to the control terminal of the first transistor T1. In the FIGURE, this control loop is formed of the transistor T3, a second diode D2 as well as resistors R1 and R2 that are connected in series. The output circuit of the transistor T3 is connected between the base of the transistor T2 and the reference potential V−. As is seen in a direction leading from the collector of the transistor T3 and from the base of the transistor T2, the resistor R2 is interposed before the base of the transistor T3. A common node point of the transistors T2, T3 and the resistor R2 is connected through a current source IQ to the positive supply potential V+. The current source IQ may, for example, be constructed as a resistor. A point of connection of the base of the transistor T3 to the resistor R2 is connected through a series circuit of the resistor R1 and the second diode D2 to the external terminal O. In this case the second diode D2 has a cathode side connected to the external terminal O.

The function of the circuit will be described in more detail below. If, due to an external problem, the output voltage at the external terminal O starts to fall below the reference potential V+, i.e. the substrate potential, the control transistor T3 is turned off with the aid of the second diode D2 and the resistor R1. The collector potential of the transistor T3 increases and turns on the series circuit of the transistors T1, T2 and the first diode D1. In this way, the voltage at the external terminal O is raised and the control loop is closed. An equilibrium state is established, in which the output voltage at the external terminal O is slightly below the reference potential, so that no minority carriers can then be injected.

In the inactive state, i.e. when there is a sufficiently high potential at the external terminal O, the second diode D2 is reverse-biased. In this case, the control transistor T3 is switched through, and its collector potential is about one diode threshold voltage above the reference potential. In this way, the series circuit having the elements T1, T2 and D1 is also off, so that the protective circuit overall is inactive.

The protective circuit which has been described with reference to bipolar transistors may, of course, also be constructed in corresponding fashion with MOS transistors.

I claim:

1. A protective circuit for reducing injection of minority carriers into a substrate containing regions forming a pn junction, the protective circuit comprising:

an external terminal;

a transistor forming said pn junction with the substrate and connected between a reference potential and said external terminal;

a series circuit formed in the substrate and connected between a supply potential and said external terminal, said series circuit having a diode and a transistor with a control terminal; and a control loop formed in the substrate, said control loop connected to said supply potential, to said external terminal, and to the control terminal of said transistor of said series circuit for controlling said transistor of said series circuit in response to changes in a voltage level at said external terminal so that the injection of said minority carriers are reduced.

2. The protective circuit according to claim 1, wherein said control loop includes a control transistor having an output side and a control terminal, the output side of said control transistor is connected to the reference potential and to said control terminal of said transistor of said series circuit, and a resistor and another diode are connected between said control terminal of said control transistor and said external terminal.

3. The protective circuit according to claim 2, wherein said control transistor has an output terminal, and another resistor is connected between said output terminal of said control transistor and said control terminal of said control transistor.

4. The protective circuit according to claim 3, wherein said transistor of said series circuit is a first transistor, a second transistor is connected upstream of said first transistor, said second transistor has a control input connected to said output terminal of said control transistor, and said second transistor has an output terminal connected to the supply potential and an output terminal connected to said control terminal of said first transistor.

5. The protective circuit according to claim 4, wherein said first transistor has an output, one of said output terminals of said second transistor and said control terminal of said first transistor define a point of connection, and a further resistor is connected between said point of connection and said output of said first transistor.

6. The protective circuit according to claim 2, wherein said diodes have cathodes connected to said external terminal.

* * * * *